United States Patent
El Amili et al.

(10) Patent No.: US 11,581,946 B2
(45) Date of Patent: Feb. 14, 2023

(54) WIDEBAND PHOTONIC SYNTHESIZER STABILIZED TO A REFERENCE CLOCK USING PHOTONIC COMPONENTS

(71) Applicant: OEWAVES, INC., Pasadena, CA (US)

(72) Inventors: Abdelkrim El Amili, Arcadia, CA (US); Danny Eliyahu, Pasadena, CA (US); Lute Maleki, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 0 days.

(21) Appl. No.: 17/538,499

(22) Filed: Nov. 30, 2021

(65) Prior Publication Data

US 2022/0190920 A1    Jun. 16, 2022

Related U.S. Application Data

(60) Provisional application No. 63/123,887, filed on Dec. 10, 2020.

(51) Int. Cl.
| | |
|---|---|
| *H04B 10/2575* | (2013.01) |
| *H04B 10/50* | (2013.01) |
| *H01S 5/065* | (2006.01) |

(52) U.S. Cl.
CPC ..... *H04B 10/25758* (2013.01); *H01S 5/0657* (2013.01); *H04B 10/506* (2013.01)

(58) Field of Classification Search
CPC ............ H04B 10/25758; H04B 10/506; H01S 5/05657

(Continued)

(56) References Cited

U.S. PATENT DOCUMENTS

| | | | |
|---|---|---|---|
| 5,379,309 A * | 1/1995 | Logan, Jr. | ............. H01S 5/4006 372/18 |
| 5,710,651 A | 1/1998 | Logan | |

(Continued)

FOREIGN PATENT DOCUMENTS

WO     WO-2005125060 A1 * 12/2005   ......... H04B 10/2575

OTHER PUBLICATIONS

Tong et al; A photonics-based scheme is proposed to generate wideband linear frequency modulation pulses with broadly tunable carrier frequencies for coherent radars; Feb. 2018; Optics letters vol. 43, No. 5; pp. 1-4. (Year: 2018).*

(Continued)

*Primary Examiner* — Amritbir K Sandhu
(74) *Attorney, Agent, or Firm* — Loza & Loza, LLP; Daniel Mallery

(57) ABSTRACT

A photonic synthesizer includes a multifrequency optical source to produce a signal of interest from a pair of lasers, which may be self-injection locked chip lasers. The signal is referenced to a high frequency clock using a photonic mixer/divider based on an electro-optical modulator and a relatively slow photodiode. The electro-optical modulator produces optical harmonics from the beams from the pair of lasers, where one harmonic from the first laser beam and one harmonic from the second laser beam beat on the photodiode. A phase locked control signal is generated for controlling the output frequency of one or both of the two lasers. The output signal of the photonic synthesizer is generated using a relatively fast photodiode based on a difference in frequencies of the pair of lasers. The output signal may be a millimeter wave-band signal. The photonic synthesizer can be formed as a photonic integrated circuit (PIC).

23 Claims, 5 Drawing Sheets

(58) Field of Classification Search
USPC .......................................................... 398/200
See application file for complete search history.

(56) References Cited

U.S. PATENT DOCUMENTS

| | | | | |
|---|---|---|---|---|
| 5,929,430 | A * | 7/1999 | Yao ........................ | H01S 5/065 398/1 |
| 6,580,532 | B1 * | 6/2003 | Yao ........................ | H03L 7/04 398/192 |
| 7,184,451 | B2 * | 2/2007 | Ilchenko ................ | H01S 5/146 372/50.123 |
| 7,609,971 | B1 * | 10/2009 | Zhou ..................... | H01Q 25/00 398/115 |
| 7,801,189 | B2 * | 9/2010 | Maleki ................... | H01S 5/0687 359/239 |
| 7,877,020 | B1 * | 1/2011 | Hayes .................... | H04B 10/50 398/198 |
| 8,331,409 | B1 * | 12/2012 | Liang .................... | H01S 3/1303 372/29.016 |
| 8,417,076 | B2 * | 4/2013 | Maleki ................... | G02F 2/002 359/239 |
| 8,452,139 | B1 * | 5/2013 | Matsko .................. | G02F 1/03 385/28 |
| 8,498,539 | B1 * | 7/2013 | Ilchenko ................ | H04B 10/90 398/115 |
| 8,681,827 | B2 * | 3/2014 | Maleki ................... | H03B 17/00 372/21 |
| 8,804,231 | B2 * | 8/2014 | Savchenkov .......... | H01S 3/1304 372/32 |
| 8,976,822 | B2 * | 3/2015 | Maleki ................... | H03B 17/00 372/28 |
| 9,680,576 | B1 * | 6/2017 | Middleton ............. | H04B 10/548 |
| 9,923,631 | B1 * | 3/2018 | Moilanen ............... | H04B 17/00 |
| 9,983,550 | B2 * | 5/2018 | Liang .................... | G04F 5/14 |
| 10,095,122 | B1 * | 10/2018 | Lee ........................ | G03F 1/84 |
| 11,251,582 | B2 * | 2/2022 | Petros .................... | H01S 3/10092 |
| 11,391,834 | B2 * | 7/2022 | Madison ................ | G01S 7/285 |
| 2003/0231315 | A1 * | 12/2003 | Arbore ................... | G01M 11/331 356/477 |
| 2006/0239312 | A1 * | 10/2006 | Kewitsch ............... | H01S 5/423 372/29.016 |
| 2008/0075464 | A1 | 3/2008 | Maleki et al. | |
| 2010/0118375 | A1 * | 5/2010 | Maleki ................... | G02F 1/0353 372/18 |
| 2013/0003766 | A1 * | 1/2013 | Savchenkov ........... | H01S 5/142 372/32 |
| 2017/0019170 | A1 * | 1/2017 | Lee ........................ | G01R 27/32 |
| 2019/0181611 | A1 * | 6/2019 | Maleki ................... | H01S 3/094076 |
| 2020/0328573 | A1 * | 10/2020 | Prather .................. | H01S 5/4012 |
| 2021/0234338 | A1 * | 7/2021 | Prather .................. | H01S 5/068 |
| 2022/0021454 | A1 * | 1/2022 | Maleki ................... | H04B 10/60 |
| 2022/0113398 | A1 * | 4/2022 | Maleki ................... | G01S 7/4917 |

OTHER PUBLICATIONS

Tong et al; Photonics-based coherent wideband linear frequency modulation pulsed signal generation; Mar. 2018; Optical Society of America; pp. 1-4. (Year: 2018).*

* cited by examiner

US 11,581,946 B2

WIDEBAND PHOTONIC SYNTHESIZER STABILIZED TO A REFERENCE CLOCK USING PHOTONIC COMPONENTS

PRIORITY CLAIM AND CROSS-REFERENCE TO RELATED APPLICATION

This patent document claims the priority of U.S. Provisional Application No. 63/123,887, entitled "WIDEBAND PHOTONIC SYNTHESIZER STABILIZED TO A REFERENCE CLOCK USING PHOTONIC COMPONENTS," filed on Dec. 10, 2020, the entire disclosure of which is incorporated by reference herein.

FIELD OF THE DISCLOSURE

Various aspects of the disclosure relate to wideband photonic systems such as microwave or millimeter-wave photonic frequency synthesizers.

BACKGROUND

A photonic frequency synthesizer is an opto-electronic device that generates or synthesizes a radio frequency (RF) signal, such as a microwave-band or millimeter wave-band RF signal, on demand. Such signals may be used in various applications including communications receivers and Radar devices. Existing RF frequency synthesizers (whether electronic or photonic) often have technical limitations in generating broadly tunable spectrally pure microwave or millimeter wave signals. These limitations may include i) narrow frequency range, which is usually less than an octave, ii) slow tuning speed, iii) large physical dimensions, iv) limited accuracy, and v) limited spectral purity. Aspects of the systems, devices, apparatus, and methods described herein are directed to addressing these limitations or other issues on existing devices.

SUMMARY

In one aspect, a photonic device is provided that includes: a first coherent optical source configured to generate a first optical signal at a first frequency; a second coherent optical source configured to generate a second optical signal at a second frequency; an optical splitter/combiner configured to generate first and second combined optical signals from the first and second optical signals, wherein the first and second combined optical signals each include the first and second frequencies; a first photonic mixer configured to receive the first combined optical signal and generate an output signal based on a difference between the first and second frequencies of the first combined optical signal; an electro-optical modulator configured to receive the second combined optical signal and generate a multifrequency optical signal from the second combined optical signal based on a modulation signal; a second photonic mixer configured to receive the multifrequency optical signal and generate an intermediate signal based on a difference between first and second frequencies of the multifrequency optical signal; and a loop filter configured to receive the intermediate signal and the modulation signal and output a control signal to the second coherent optical source for controlling the second frequency provided within the second optical signal.

In another aspect, a method for use by a photonic device includes: generating a first optical signal at a first frequency using a first coherent optical source; generating a second optical signal at a second frequency using a second coherent optical source; generating first and second combined optical signals from the first and second optical signals, wherein the first and second combined optical signals each include the first and second frequencies; generating an output signal from the first combined optical signal based on a difference between the first and second frequencies of the first combined optical signal; generating a multifrequency optical signal from the second combined optical signal based on a modulation signal; generating an intermediate signal based on a difference between first and second frequencies of the multifrequency optical signal; generating a control signal from the intermediate signal and the modulation signal; and applying the control signal to the second coherent optical source to control the second frequency provided within the second optical signal to control a frequency of the output signal while keeping the frequency of the output signal locked to a reference frequency or clock.

In yet another aspect, a photonic device is provided that includes: a polychromatic optical source; an opto-electronic frequency mixer; an RF reference signal source; and an electronic feedback loop configured to stabilize a relative frequency of the polychromatic optical source to the RF reference signal using electrical signals from the opto-electronic frequency mixer.

DETAILED DESCRIPTION

Figure 1:
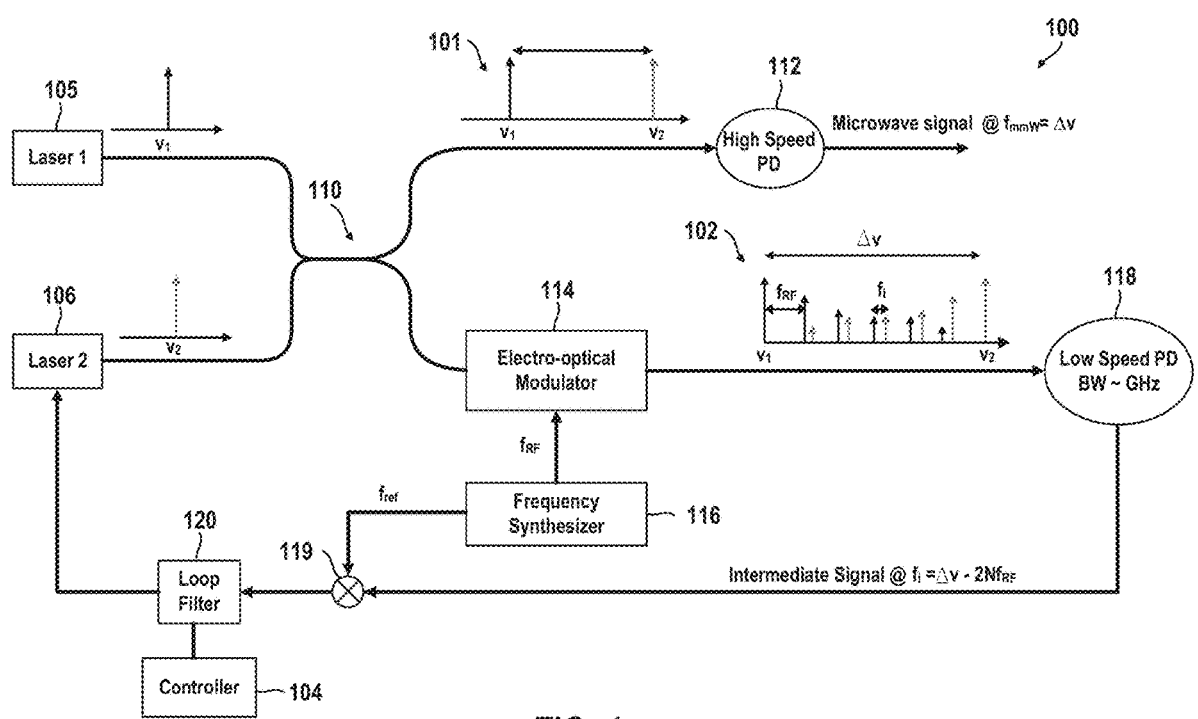
FIG. 1 illustrates a first exemplary photonic device.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure. In the figures, elements may each have a same reference number or a different reference number to suggest that the elements represented could be different and/or similar. However, an element may be flexible enough to have different implementations and work with some or all of the systems shown or described herein. The various elements shown in the figures may be the same or different and, which one is referred to as a first element and which is called a second element is arbitrary.

Overview

Microwave or millimeter (mm) wave signals can be generated or synthesized photonically using mode locked lasers or tunable continuous wave (CW) lasers. An exemplary photonic generator or synthesizer configured using a mode locked laser may provide for the spectral shaping of a supercontinuum optical source, followed by wavelength-to-time mapping, as well as other procedures such as those involving polychromatic optical radiation (e.g., optical frequency combs). However, microwave or mm-wave photonic generators or synthesizers with mode locked lasers can be bulky, and photonic microdevices based on frequency combs are not yet sufficiently mature for many practical applications.

A photonics-based oscillator on a continuous wave (CW) laser may include a laser beam consisting of two or more coherent longitudinal modes with frequency spacing equal to a wanted output frequency. As the longitudinal modes beat with each other in the photodiode, a particular electrical microwave or mm-wave output signal can be generated. A change of the relative frequency of the lasers results in change of the frequency of the output signal. A change of the power of the lasers results in change of the power of the output signals. If the two longitudinal modes generated by a dual-mode laser (or by two separate lasers) have low coherency, an RF signal generated by their beating will have poor spectral purity. Stabilization of such lasers calls for bulky optical cavities. In addition, most such lasers cannot be tuned fast enough. One of major problems related to frequency synthesis for practical microwave or mm-wave applications is related to referencing the signal generated by, e.g., a photonic flywheel to a master oscillator or clock. Herein, among other features, a pure photonic solution to clock or frequency referencing is set forth, which also addresses the various issues noted above.

Other aspects described herein provide for miniature low noise lasers integrated with an electro-optical modulator to enable a miniature microwave or mm-wave synthesizer. Due to the small size of the devices and their tight integration, common fluctuations from the ambient environment or other sources can be efficiently reduced leading to improved spectral purity of the generated signals. In some aspects, the configuration involves two tunable low noise lasers, a separately actuatable multifrequency optical source produced by an electro-optic modulator fed with a signal from a high stability reference oscillator or clock. By locking the frequency difference between the generated optical harmonics, carried on the lasers, to the reference signal facilitates generation of an accurate, stable, and spectrally pure microwave/millimeter wave signal. The tight integration can achieve a very small device footprint and limit acceleration sensitivity.

In some examples, the lasers are self-injection locked to a tunable optical microcavity such as a whispering gallery mode (WGM) resonator or similar resonator, such as a ring resonator. Self-injection locking allows efficient decoupling of the frequency and amplitude modulation of the lasers that provides flexibility to the locking the laser frequency difference to a clock signal. Systems and architectures described herein can be implemented on a photonic integrated circuit (PIC) with homogeneous integration of the active and passive optical components. With a suitable choice of lasers and integration strategy, microwave signals can be produced with well-defined carrier frequency and low phase noise.

It is noted that photonic systems that generate microwaves using two modes of the same laser can achieve good thermal and mechanical overlap to reduce common noise. However, unlike the devices described herein, the frequency difference of the two modes as well as the emission power of the modes generally cannot be tuned as agilely as compared with the tuning speed and versatility of the devices described herein that use two separate lasers. The lasers used for the RF signal generation should be highly monochromatic. Admixture of the higher order modes will result in the contamination of the generated RF signals.

A novel aspect of the exemplary synthesizers described herein is in the combination of a polychromatic optical source, opto-electronic frequency mixer (e.g., an electro-optical or electro-absorption modulator), an RF reference signal, and an electronic feedback loop configured to stabilize of the relative frequency of the polychromatic optical source to the RF reference signal.

Another novelty point is in the tight integration of the opto-electronic components on a chip to reduce common temperature related noise of the components.

Another novelty point is related to usage of agile lasers characterized with exceptional spectral purity at low offset spectral frequencies. An RF frequency created by these lasers can be efficiently phase locked to an RF source, while a beat of standard lasers is usually too broad to acquire and sustain the locking.

Applications

Miniature microwave or mm-wave synthesizers offer significant applications potential, such as radar measurements, data exchange with increased transmission rate and multipath tolerance in wireless communications (e.g., 5G and 6G applications). The signals characterized with ultrabroadband tunability are inherently difficult to generate with chip-based electronics due to limits in digital-to-analog converter technology and high timing jitter.

Emerging RF communications and sensing systems may require new frequency synthesizers for agile operations at wide frequency bands. (Herein, by "agile," it is meant that the device can quickly shift its operating frequencies or other parameters and characteristics.) In particular, communications systems such as cognitive radio may require the ability to operate in multiple octaves of frequency along with the capability to change frequency in sub-microsecond time scales. These capabilities are particularly important in the mm-wave (MMW) domain, where varying attenuation of different frequency bands due to atmospheric absorption could be put to advantage for multifunction and covert operations. Systems with such functionality may be most useful if they conform to limitations of size, weight, and power (SWaP) of small platforms, such as unmanned vehicles.

Frequency synthesizers often play a crucial role in the architecture of data sampling and processing systems. In particular, wideband MMW communication systems may require access to high spectral purity reference signals that span an entire band of interest. For instance, for a cognitive radio to operate in 30-120 GHz band, reference signals covering essentially the same frequency interval may be needed to enable down conversion and extraction of the signal of interest. Currently there are major shortfalls in the technology, especially if high spectral purity and small SWaP are also required.

Electronic means for generating MMW reference frequencies are generally limited in bandwidth, not only due to the resonators that may be required for high spectral purity, but also by current broadband amplifier unavailability. By contrast, in photonic systems, 120 GHz is a fairly small percentage of the carrier (light) frequency. Furthermore, optical components such as modulators and photodetectors are available as commercial off the shelf (COTS) with bandwidth in excess of 100 GHz, and many optical components have generally inherently low loss, and small size and weight, making them suitable for low SWaP assemblies. Such factors make photonics particularly useful for the synthesis of high-frequency microwave and mm-wave signals.

Operational Principles

An efficient photonic approach for synthesis of a wideband tunable microwave signal involves beating two lasers together on a fast photonic mixer, such as a photodiode. If the lasers are phase locked, the lasers produce a beat note that can be tuned by tuning the frequency (wavelength) of one or both of the lasers. While a practical solution, this approach may suffer from a number of limitations. For example, phase locking of two lasers is complex, especially when a wide tunable range is required. Electronic approaches for phase locking may require a tunable electronic oscillator and wideband amplifiers, which invokes some of the limitations discussed above. Furthermore, the beat frequency might not produce a spectral purity that is high enough, unless the lasers are highly spectrally pure, i.e., they each have very narrow linewidths. This limitation may be overcome by locking each laser to a high finesse optical cavity, but then the tunability range can suffer. In the examples described below, a synthesizer design is presented that is completely or substantially free of these problems. First, the synthesizer design provides broadband mixing in the photonic domain Second, the synthesizer design uses spectrally pure lasers suitable for efficient phase locking.

Note that the quality of the signal generated by the photonic synthesizer depends on the quality of the light emitted by the lasers. The phase noise of the generated RF signal $L_{RF}$ is related to the phase noise of the lasers demodulated at a fast photodiode $L_{laser}$ as $L_{RF}=2L_{laser}$, where L represents power spectral density of phase noise. Here, a worst case is assumed when the lasers are not correlated. Therefore, to generate 100 GHz signal characterized with a phase noise $L_{RF}=-150$ dBc/Hz at 10 MHz, the optical signal should have a phase noise $L_{laser}=-153$ dBc/Hz at 10 MHz. Such a value for the phase noise is achievable with good semiconductor and fiber lasers. The lasers can be stabilized for better spectral purity. In the examples herein, tunable laser chip-scale systems are used that are based on semiconductor lasers for a small size of the system.

The diode lasers can be self-injection locked by means of high quality factor optical cavities for better spectral purity. The backscattered light returned to the diode facet forces the diode laser to injection lock to the resonator mode. This process is referred to as self-injection locking. Tuning of the resonator frequency, through electro-optic effect, tunes the laser wavelength. A self-injection locked laser has narrower linewidth, larger side mode suppression, more rarified frequency and spatial mode spectra, and wider tuning range than the bare diode laser. Properly configured, the device is tunable over tens of GHz in sub-microsecond time. Another advantage of the synthesizer design provided herein is that its operational frequency can, fundamentally, reach G-band and higher without degradation of the spectral purity of the generated signal (because the noise of the lasers generating the RF frequency does not degrade with their frequency difference). The phase noise of the synthesizer does not change through the entire operation band within the bandwidth a given photodetector.

Generally speaking, the synthesizer design includes a multifrequency optical source to produce a signal of interest. The signal is referenced to a clock using a photonic mixer/divider based on an electro-optical modulator and a slow photodiode.

Exemplary Methods and Apparatus

FIG. 1 is a block diagram of an exemplary wideband photonic frequency synthesizer 100. Lasers #1 105 and #2 106 (which might be laser chips or other suitable devices for generating coherent optical beams) produce a pair of spectrally pure optical beams ($v_1$, $v_2$) separated by frequency $\Delta v$. The two beams emitted by the two lasers are applied (using suitable waveguides, or in free space) to a splitter/combiner 110 that splits each of the separate laser beams while also (a) combining half of the beam from laser #1 with half of the beam from laser #2 for applying to a high speed photodetector (PD) 112 and while also (b) combining half of the beam from laser #1 with half of the beam from laser #2 for applying to an electro-optical (E-O) modulator 114. Note, though, that the split need not be 50/50. A 50/50 split is used herein as an illustrative example. Note also that, although not shown in FIG. 1, the two lasers may be self-injection locked using a WGM resonator or the like interposed between the lasers and the splitter/combiner.

One beam from the splitter/combiner 110 is directed to the fast photodiode 112 (or suitable photonic mixer), which produces a high frequency mm-wave output signal with $f_{mmW}=\Delta v$. That is, the optical beam applied to the high speed photodetector 112 has a beat frequency due to the difference in frequency of the two laser beams ($v_1$, $v_2$) and that beat is detected by the photodetector 112 and converted into an output signal at the frequency of the beat ($f_{mmW}=\Delta v$). The two frequencies of the beam applied to the high-speed photodetector 112 are shown in graph 101, which also illustrates $\Delta v$. Within the graph, the frequency $v_1$ is shown with a solid arrow. The frequency $v_2$ is shown with a gray arrow. In other examples, the output signal may be any RF signal rather than mmW, sub-mm or higher.

The other beam from the splitter/combiner 110 is sent through the electro-optical modulator 114, which modulates the beam using a frequency $f_{RF}$. The modulation frequency $f_{RF}$ is produced by an RF synthesizer 116 (which may be locked to a reference oscillator, not separately shown, that produces a reference clock signals at $f_{ref}$). The electro-optical modulator 114 generates a set of harmonic sidebands for each of the two laser frequencies ($v_1$, $v_2$) as shown by graph 102. Within the graph 102, the frequency $v_1$ and its modulation sidebands are shown with solid arrows. The frequency $v_2$ and its modulation sidebands are shown with gray arrows. As shown, the modulation sidebands produced from the two optical carriers do not overlap. Notably, at least one of sidebands of v1 is close in frequency to one of the sidebands of v2 and is separated, in this example, by a frequency of $f_i$. The modulated light is applied to a slow or low-speed photodiode 118 having a bandwidth, in this example, of about 1 GHz. The low-speed photodiode 118 can only detect lower frequencies and as configured will reject the primary optical frequencies ($v_1$, $v_2$) and their major sidebands and only responds to the closely adjacent sidebands separated by frequency of $f_i$. If required, the rejection of the higher frequency sidebands may also be achieved by including suitable bandpass filters or the like in front of the low-speed photodetector 118. The low-speed photodiode 118 produces an intermediate signal with a frequency of $f_i$. That is, the optical beam applied to the low-speed photodetector 118 has a beat pattern due to the difference in frequency of the two adjacent sidebands each associated with each laser #1 and laser #2 (which are separated by $f_i$) and those beats are detected by the low-speed photodetector 118 and converted into an intermediate signal at the frequency of the beats ($f_i$).

The intermediate signal at frequency $f_i$ is combined via a combiner 119 with a signal at fret. (generated by the reference oscillator within or external to the frequency synthesizer 116) and the resulting signal is applied to a loop filter 120 (e.g. a phase locked loop) to generate a control signal for controlling Laser #2 to adjust its frequency $v_2$ to reduce any drift in $\Delta V$. Depending upon the type of laser, the frequency $v_2$ of Laser #2 may be adjusted based on adjusting electrical current, voltage, temperature, etc., to achieve desired frequency changes. In particular, Laser #2 may be controlled to hold $f_i$ at a particular frequency. So long as $f_i$ does not change, $\Delta v$ does not change. If $f_i$ begins to increase due to a drift in either Laser #1 or Laser #2, Laser #2 is automatically adjusted (via the signal from the loop filter 120) to return $f_i$ to its previous value. Likewise, if $f_i$ begins to decrease, Laser #2 is automatically adjusted (via the signal from the loop filter 120) to return $f_i$ to its previous value. In this manner, any drift between $v_1$ and $v_2$ may be quickly and automatically compensated so that the output frequency $f_{mmW}$ remains locked to a particular desired reference frequency (for whatever application the signal is used for, such as for use in generating a radar signal within a radar device). In some examples, $f_i$ may be set to $f_i=\Delta v-2Nf_{RF}$ where N is the number of the sideband (first sideband, second sideband, etc.

Note that the mm-wave output of the high-speed photodiode 112 may be amplified for some applications. Note also that, as shown by way of controller 104, the loop filter 120 may be controlled by a smart device to change the output frequency ($v_2$) of Laser #2 to cause a desired change in the frequency $f_{mmW}$ of the output signal, while $f_{mmW}$ remains locked to the reference frequency. For example, for some applications, the output frequency $f_{mmW}$ may be "chirped" by sweeping the frequency over a range of frequencies. In other examples, the controller 104 may be configured to cause the frequency $f_{mmW}$ of the output signal to switch quickly from one desired frequency to another. Note also that, although FIG. 1 shows that Laser #2 is controlled by the output of the loop filter, in other examples, Laser 3 1 might instead be controlled, or both Laser #1 and Laser #2.

Generally speaking, any laser design can be used for the two lasers (e.g., diode, fiber, solid state, gas) so long as the lasers have low noise and fast actuation ability (as discussed above). Direct modulation of the lasers may be feasible in some designs such as Vertical-cavity surface-emitting laser (VCSEL). Self-injection locking to tunable optical cavities can be utilized to improve laser noise. Any suitable modulator (e.g., amplitude, phase, electro-absorptive) can be used. Nonlinear photonic mixers can be used instead of one or both of the photodiodes.

Figure 2:
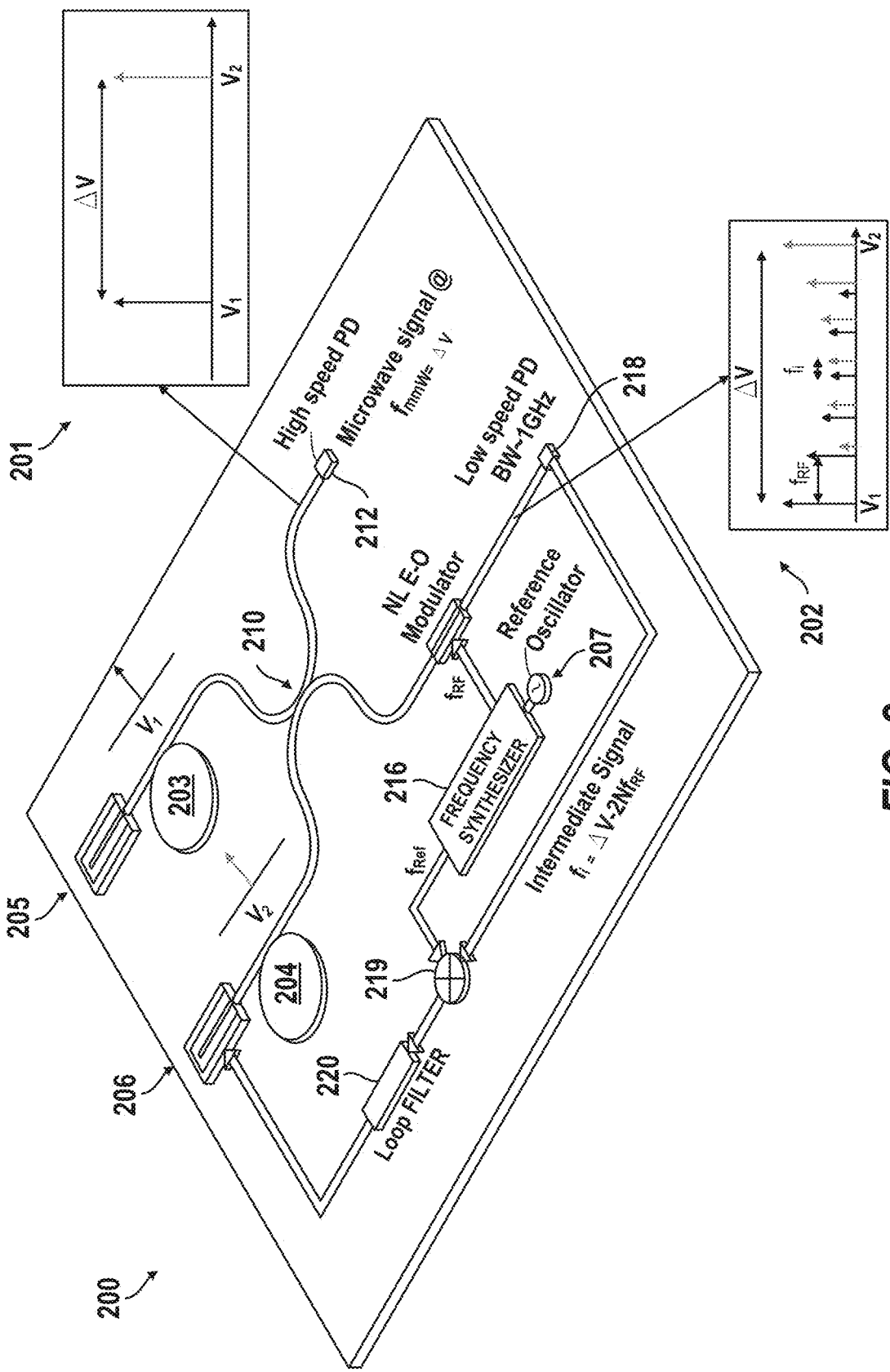
FIG. 2 illustrates a second exemplary photonic device.

FIG. 2 illustrates a PIC design of a photonic synthesizer 200 similar to the synthesizer of FIG. 1, but with WGM resonators 203, 204 positioned along waveguides that receive output signals from the two laser chips 205, 206, respectively. As explained above, WGM resonators allow the lasers to be self-injection locked. Graphs 201 and 202 are provided to illustrate the frequency components of the beams applied to the high-speed and low-speed PDs, as already explained. FIG. 2 also illustrates a reference oscillator 207 that generates the reference clock signal. Otherwise, the components are the same or similar to the device of FIG. 1 and will not be described again in detail other than to note that the synthesizer 200 includes a splitter/combiner 210, a frequency synthesizer 216, a high speed PD 212, a low speed PD 218, a combiner 219, and a loop filter 220.

Figure 3:
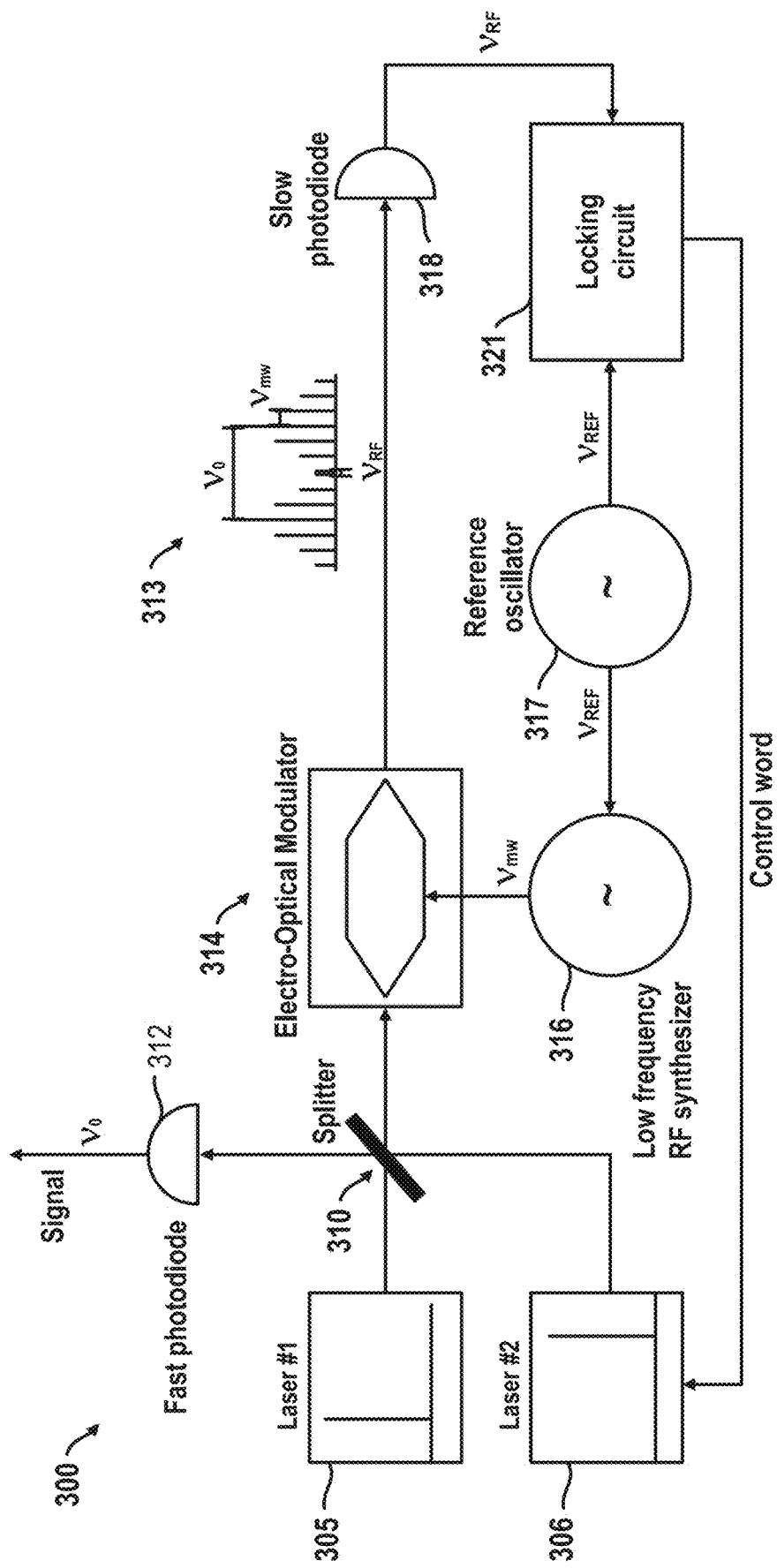
FIG. 3 illustrates a third exemplary photonic device.

FIG. 3 is a schematic illustration of an alternative photonic synthesizer 300 wherein the reference oscillator 317 provides a reference clock signal directly to a locking circuit 321, which may be similar to the loop filter of FIGS. 1 and 2 (though modified, if needed, to account for the higher frequency input provided by $V_{REF}$) Note, also, that the symbols and terminology used in FIG. 1 differ from that of FIGS. 1 and 2. For example, $v_0$ is used instead of $\Delta v$, $v_{mw}$ is used instead of $f_{RF}$, $v_{RF}$ is used instead of $f_i$, etc. A graph 313 illustrates these parameters. As can be appreciated, different symbols and terminology may be used and this has no bearing on the substantive operation of the device. Otherwise, the components are the same or similar to the devices of FIGS. 1 and 2 and will not be described again in detail other than to note that the synthesizer 300 includes lasers 305 and 306, a splitter/combiner 310, an EOM 314, a low frequency RF synthesizer 316, a high speed PD 312, and a low speed PD 318.

Photonic frequency synthesis methods may be employed using the devices of FIGS. 1-3 or other suitably equipped devices.

Figure 4:
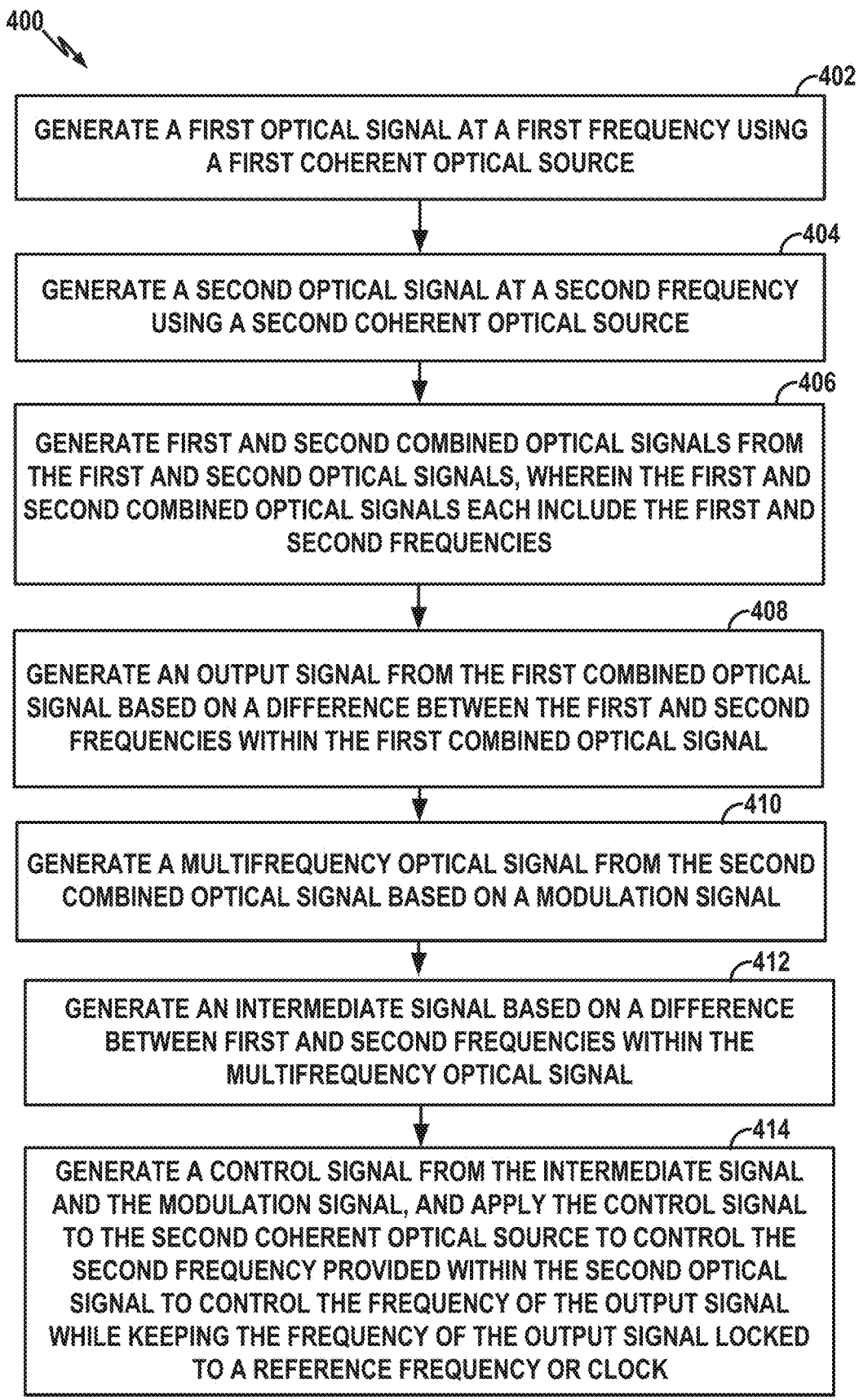
FIG. 4 illustrates an exemplary photonic signal synthesis method.

FIG. 4 summarizes an illustrative photonic frequency synthesis method 400 that may be performed using, for example, the photonic device of FIG. 1. Briefly, at block 402, the photonic device generates a first optical signal at a first frequency using a first coherent optical source (e.g., a first laser). At block 404, the photonic device concurrently generates a second optical signal at a second frequency using a second coherent optical source (e.g., a second laser). At block 406, the photonic device generates first and second combined optical signals from the first and second optical signals (using, e.g., combiner/splitter), where the first and second combined optical signals each include the first and second frequencies. At block 408, the photonic device begins generating an output signal from the first combined optical signal based on a difference between the first and second frequencies within the first combined optical signal (using, e.g., a fast photodiode). At block 410, the photonic device concurrently generates a multifrequency optical signal from the second combined optical signal (using, e.g., an E-O modulator) based on a modulation signal, which may be derived from a reference clock signal from a reference oscillator. In some examples, the multifrequency optical signal is generated to have first and second sets of sidebands derived from the first and second frequencies, respectively, of the combined optical signal, wherein the first frequency within the multifrequency optical signal is a sideband of the first set of sidebands, and wherein the second frequency within the multifrequency optical signal is a sideband of the second set of sidebands.

At block 412, the photonic device generates an intermediate signal based on a difference between first and second frequencies within the multifrequency optical signal (using, e.g., a slow photodiode). At block 414, the photonic device generates a control signal from the intermediate signal and the modulation signal (using, e.g., a loop filter with a phase locked loop) and then applies the control signal to the second coherent optical source to control the second frequency provided within the second optical signal to control a frequency of the output signal.

Note that the intermediate signal may be generated based on a difference between the sideband of the first set of sidebands and the sideband of the second set of sidebands. The control signal may be generated to adjust the second coherent light source to compensate for drift in the output frequencies of either or both of the first and second coherent optical sources to lock the frequency of the output signal from the first photonic mixer to a particular output frequency. In other examples, the control signal is generated to adjust the second coherent light source to change the frequency of the output signal to, for example, sweep the output signal or chirp the output signal.

Figure 5:
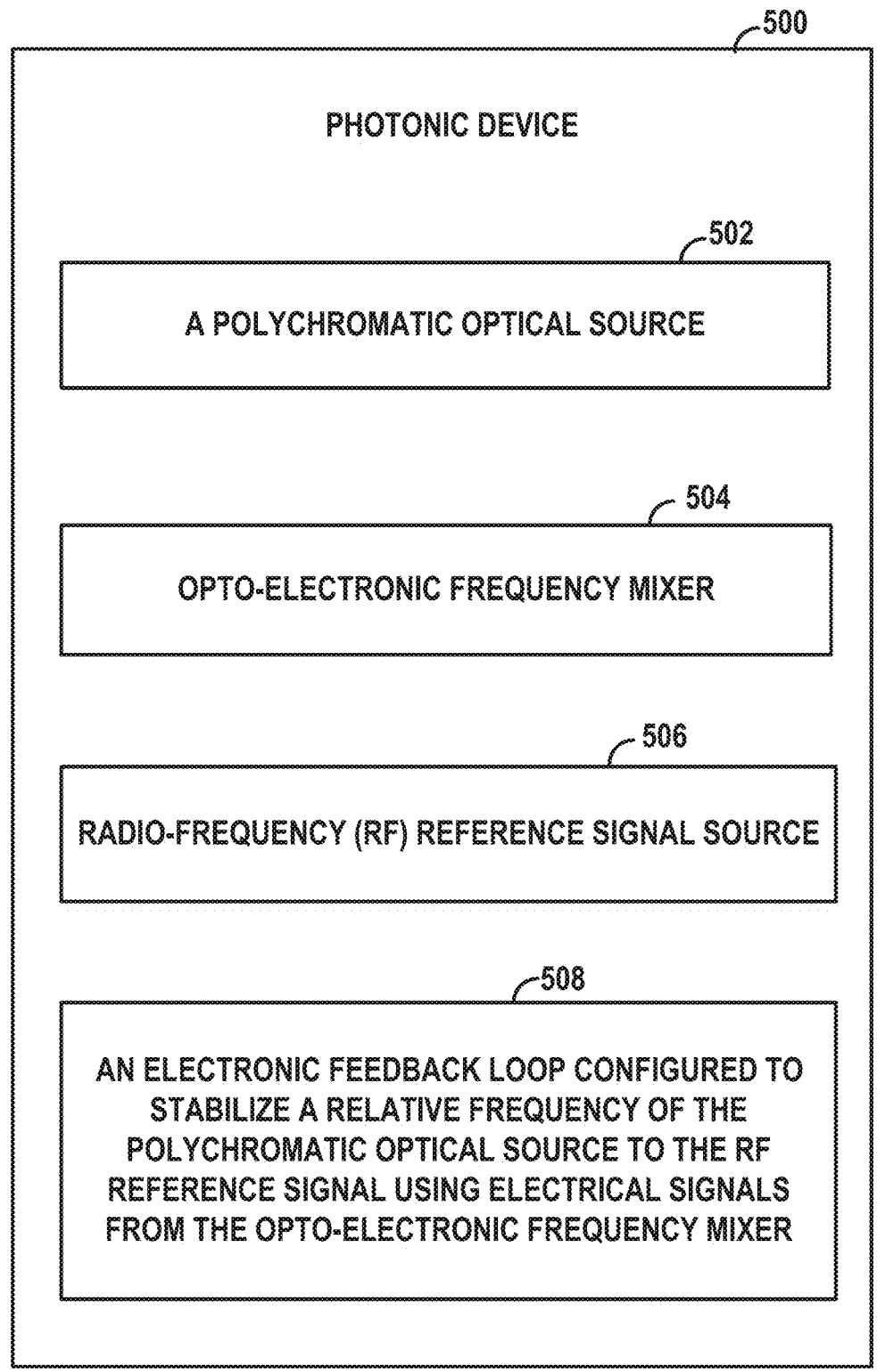
FIG. 5 illustrates yet another exemplary photonic device.

FIG. 5 is a block diagram illustrating, at a high level, an exemplary photonic device 500. Briefly, the photonic device 500 includes: a polychromatic optical source 502; an optoelectronic frequency mixer 504; an RF reference signal source 506; and an electronic feedback loop 508 configured to stabilize a relative frequency of the polychromatic optical source 502 to the RF reference signal using electrical signals obtained from the opto-electronic frequency mixer 504. The above-described photonic methods and devices may be used to implement the system of FIG. 5.

Additional Aspects and Considerations

Note that one or more of the components, steps, features, and/or functions illustrated in FIGS. 1, 2, 3, 4, and/or 5 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, an aspect is an implementation or example. Reference in the specification to "an aspect," "one aspect," "some aspects," "various aspects," or "other aspects" means that a particular feature, structure, or characteristic described in connection with the aspects is included in at least some aspects, but not necessarily all aspects, of the present techniques. The various appearances of "an aspect," "one aspect," or "some aspects" are not necessarily all referring to the same aspects. Elements or aspects from an aspect can be combined with elements or aspects of another aspect.

The term "coupled" may mean that two or more elements are in direct physical or electrical contact. However, "coupled" may also mean that two or more elements are not in direct contact with each other, but yet still co-operate or interact with each other.

Not all components, features, structures, characteristics, etc. described and illustrated herein need be included in a particular aspect or aspects. If the specification states a component, feature, structure, or characteristic "may," "might," "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although some aspects have been described in reference to particular implementations, other implementations are possible. Additionally, the arrangement and/or order of elements or other features illustrated in the drawings and/or described herein need not be arranged in the particular way illustrated and described. Many other arrangements are possible according to some aspects.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features described herein can be implemented in different systems without departing from the invention as it is set forth in the claims. It should be noted that the foregoing aspects of the disclosure are merely examples and are not to be construed as limiting the claims. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A photonic device comprising:
   a first laser configured to generate a first coherent optical signal at a first frequency;
   a second laser configured to generate a second coherent optical signal at a second frequency;
   an optical splitter/combiner configured to generate first and second combined optical signals from the first and second coherent optical signals, wherein the first and second combined optical signals each include the first and second frequencies;
   a first photonic mixer configured to receive the first combined optical signal and generate an output signal based on a difference between the first and second frequencies of the first combined optical signal;
   an electro-optical modulator configured to receive the second combined optical signal and generate a multifrequency optical signal from the second combined optical signal based on a modulation signal;
   a second photonic mixer configured to receive the multifrequency optical signal and generate an intermediate signal based on a difference between first and second frequencies of the multifrequency optical signal; and
   a loop filter configured to receive the intermediate signal and the modulation signal and output a control signal to the second laser for controlling the second frequency provided within the second coherent optical signal.

2. The device of claim 1, wherein the first and second lasers are stabilized via an active stabilization system.

3. The device of claim 1, wherein the first and second lasers are stabilized via self-injection locking by a means for passive locking using optical cavities.

4. The device of claim 3, further comprising a first whispering gallery mode (WGM) resonator coupled to the first laser and a second WGM resonator coupled to the second laser.

5. The device of claim 1, wherein the optical splitter/combiner is an optical waveguide component.

6. The device of claim 1, wherein the first photonic mixer is a first photodiode configured to operate at millimeter wave frequencies.

7. The device of claim 1,
   wherein the electro-optical modulator is configured to generate the multifrequency optical signal to have first and second sets of sidebands from the first and second frequencies, respectively, of the combined optical signal,
   wherein the first frequency of the multifrequency optical signal comprises a sideband of the first set of sidebands, and wherein the second frequency of the multifrequency optical signal comprises a sideband of the second set of sidebands.

8. The device of claim 7, wherein the second photonic mixer is a second photodiode configured to generate the intermediate signal based on a frequency difference between the sideband of the first set of sidebands and the sideband of the second set of sidebands.

9. The device of claim 8, wherein the second photonic mixer is configured to reject other sidebands of the first and second sets of sidebands.

10. The device in claim 9, where the second photonic mixer transmits only a smallest intermediate frequency produced by mixing of the modulated optical signals.

11. The device of claim 1, wherein the loop filter is a component of a phase locked loop.

12. The device of claim 1, further comprising a frequency synthesizer configured to generate the modulation signal from a reference signal.

13. The device of claim 12, further comprising a reference oscillator configured to generate the reference signal.

14. The device of claim 1, wherein the loop filter is configured to generate the control signal to adjust the second laser to compensate for drift in the output frequencies of either or both of the first and second lasers to lock the frequency of the output signal from the first photonic mixer to a particular output frequency.

15. The device of claim 1, further comprising a controller configured to control the loop filter to generate the control signal to adjust the second laser to change the frequency of the output signal from the first photonic mixer.

16. The device of claim 15, wherein the controller is configured to control the loop filter to generate the control signal to adjust the second laser to sweep the frequency of the output signal through a range of frequencies.

17. A method for use by a photonic device, the method comprising:
generating a first optical signal at a first frequency using a first coherent optical source;
generating a second optical signal at a second frequency using a second coherent optical source;
generating first and second combined optical signals from the first and second optical signals, wherein the first and second combined optical signals each include the first and second frequencies;
generating an output signal from the first combined optical signal based on a difference between the first and second frequencies of the first combined optical signal;
generating a multifrequency optical signal from the second combined optical signal based on a modulation signal;
generating an intermediate signal based on a difference between first and second frequencies of the multifrequency optical signal;
generating a control signal from the intermediate signal and the modulation signal; and
applying the control signal to the second coherent optical source to control the second frequency provided within the second optical signal to control a frequency of the output signal while keeping the frequency of the output signal locked to a reference frequency or clock.

18. The method of claim 17,
wherein the multifrequency optical signal is generated to have first and second sets of sidebands derived from the first and second frequencies, respectively, of the combined optical signal,
wherein the first frequency of the multifrequency optical signal comprises a sideband of the first set of sidebands, and
wherein the second frequency of the multifrequency optical signal comprises a sideband of the second set of sidebands.

19. The method of claim 18, wherein the intermediate signal is generated based on a difference between the sideband of the first set of sidebands and the sideband of the second set of sidebands.

20. The method of claim 17, wherein the control signal is generated to adjust the second coherent light source to compensate for drift in the output frequencies of either or both of the first and second coherent optical sources to lock the frequency of the output signal from the first photonic mixer to a particular output frequency.

21. The method of claim 17, wherein the control signal is generated to adjust the second coherent light source to change the frequency of the output signal while keeping the output signal locked to the reference frequency or clock.

22. The photonic device of claim 1, wherein the device is configured as a photonic integrated circuit (PIC).

23. A photonic apparatus comprising:
means for generating a first coherent optical signal at a first frequency;
means for generating a second coherent optical signal at a second frequency;
means for generating first and second combined optical signals from the first and second coherent optical signals, wherein the first and second combined optical signals each include the first and second frequencies;
means for receiving the first combined optical signal and generating an output signal based on a difference between the first and second frequencies of the first combined optical signal;
means for receiving the second combined optical signal and generating a multifrequency optical signal from the second combined optical signal based on a modulation signal;
means for receiving the multifrequency optical signal and generating an intermediate signal based on a difference between first and second frequencies of the multifrequency optical signal; and
loop filter means for receiving the intermediate signal and the modulation signal and outputting a control signal to the means for generating the second coherent optical signal to control the second frequency provided within the second coherent optical signal.

* * * * *